(12) United States Patent
Yang et al.

(10) Patent No.: US 8,785,320 B2
(45) Date of Patent: Jul. 22, 2014

(54) STRUCTURE AND PROCESS FOR METALLIZATION IN HIGH ASPECT RATIO FEATURES

(71) Applicant: International Business Machines Corporation, Armonk, NY (US)

(72) Inventors: Chih-Chao Yang, Glenmont, NY (US); Fenton R. McFeely, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/901,886

(22) Filed: May 24, 2013

(65) Prior Publication Data

US 2013/0252415 A1 Sep. 26, 2013

Related U.S. Application Data

(60) Continuation of application No. 13/453,508, filed on Apr. 23, 2012, now Pat. No. 8,450,204, which is a division of application No. 12/034,708, filed on Feb. 21, 2008, now Pat. No. 8,232,647.

(51) Int. Cl.
| | |
|---|---|
| *H01L 21/4763* | (2006.01) |
| *H01L 21/768* | (2006.01) |
| *H01L 21/74* | (2006.01) |
| *H01L 21/02* | (2006.01) |

(52) U.S. Cl.
CPC ........ *H01L 21/76879* (2013.01); *H01L 21/743* (2013.01); *H01L 21/02362* (2013.01)
USPC ........... 438/627; 257/751; 257/750; 257/741; 257/E23.01; 257/E21.649; 257/768; 257/769

(58) Field of Classification Search
USPC ......... 257/396–413, 767, 602, 383, 768–769, 257/E21.649, E29.158; 438/627
IPC .................... H01L 21/76897,21/76879, 21/743, H01L 21/02304, 21/02362
See application file for complete search history.

(56) References Cited

U.S. PATENT DOCUMENTS

| | | | |
|---|---|---|---|
| 5,027,185 | A | 6/1991 | Liauh |
| 5,891,513 | A | 4/1999 | Dubin et al. |
| 6,143,645 | A | 11/2000 | Hsu et al. |
| 6,638,873 | B2 | 10/2003 | Furukawa |
| 7,086,138 | B2 | 8/2006 | Anderson |
| 7,727,890 | B2 | 6/2010 | Edelstein et al. |
| 2002/0121699 | A1 | 9/2002 | Cheng et al. |
| 2002/0127790 | A1 | 9/2002 | Hongo et al. |
| 2002/0127867 | A1 | 9/2002 | Lee |
| 2005/0145985 | A1 | 7/2005 | Takaya |
| 2007/0114671 | A1 | 5/2007 | Hsu et al. |
| 2008/0230906 | A1 | 9/2008 | Wong et al. |

*Primary Examiner* — Eva Yan Montalvo
(74) *Attorney, Agent, or Firm* — Scully, Scott, Murphy & Presser, P.C.; Katherine S. Brown

(57) ABSTRACT

A high aspect ratio metallization structure is provided in which a noble metal-containing material is present at least within a lower portion of a contact opening located in a dielectric material and is in direct contact with a metal semiconductor alloy located on an upper surface of a material stack of at least one semiconductor device. In one embodiment, the noble metal-containing material is plug located within the lower region of the contact opening and an upper region of the contact opening includes a conductive metal-containing material. The conductive metal-containing material is separated from plug of noble metal-containing material by a bottom walled portion of a U-shaped diffusion barrier. In another embodiment, the noble metal-containing material is present throughout the entire contact opening.

18 Claims, 5 Drawing Sheets

STRUCTURE AND PROCESS FOR METALLIZATION IN HIGH ASPECT RATIO FEATURES

CROSS REFERENCE TO RELATED APPLICATION

This application is a continuation of U.S. patent application Ser. No. 13/453,508, filed Apr. 23, 2012, which is a divisional of U.S. patent application Ser. No. 12/034,708, filed Feb. 21, 2008, now U.S. Pat. No. 8,232,647 the entire content and disclosure of each is incorporated herein by reference.

FIELD OF THE INVENTION

The present invention relates to a semiconductor structure and a method of fabricating the same. More particularly, the present invention relates to a reliable high aspect ratio metallization structure used in contacting underlying semiconductor devices to external components of a semiconductor chip. The present invention also provides a method of fabricating a high aspect ratio metallization structure.

BACKGROUND OF THE INVENTION

A semiconductor device, such as, for example, a field effect transistor, is often formed with both back end of the line (BEOL) contacts to the gate and source/drain regions of the device to turn the device on/off and to allow current to flow through the device, respectively, and a middle of the line (MOL) contact to the body of the device between the source/drain regions to adjust threshold voltage (Vt).

Traditionally, conductive metals, such as tungsten (W) and aluminum (Al) have been deposited (e.g., by chemical vapor deposition (CVD), sputtering, etc.) into patterned openings (i.e., vias), which are present in the dielectric material of the metallization structure, to form both MOL and BEOL contacts. Recently, because of its lower electrical resistivity copper and copper alloys, which require plating, have become the preferred metal for filling the contact openings in both BEOL and MOL metallization structures.

Unfortunately, as circuit densities are increased, the aspect ratio (i.e., the ratio of height to width) for both BEOL and MOL contact (i.e., metallization) structures has increased and adequate plating of such high aspect ratio metallization structures has proven difficult. Specifically, as circuit densities increase and device sizes are scaled, the width of both BEOL and MOL contact (i.e., metallization) structures is decreased; however, the thickness of the dielectric layers in which these contacts are formed has remained the same (i.e., contact or metallization structures with high height to width ratios). For example, circuit designers currently require MOL and BEOL contacts with aspect ratios that are greater 6:1 and oftentimes greater than 10:1. When conventional plating techniques are used to fill these high aspect ratio openings, seams and voids (collectively referred to as a key-hole seam) develop within the contact (i.e., metallization) structure.

FIG. 1 is a prior art semiconductor structure 10 which includes a contact (i.e., metallization) structure 20. As shown, the prior art structure 10 includes a field effect transistor (FET) 12 including a material stack 14 comprising at least a gate dielectric and an overlying gate conductor; both are not specifically shown or labeled but are collectively meant to be included within material stack 14. The material stack 14, which is patterned, also has an upper surface 15 that comprises a metal semiconductor alloy, i.e., a metal silicide or metal germanide, contact. The FET is located on a surface of a semiconductor substrate (not specifically shown) in which the source/drain regions are present. The FET 12 includes at least one spacer 16 located on exposed sidewalls of the material stack 14. The contact structure 20 includes a dielectric material 22 having a high aspect contact opening that is filled with a conductive metal 24 such as W, Al or Cu which is in contact with the upper surface 15 (i.e., the metal semiconductor alloy) of the material stack 14. As is shown, and since prior plating processes have been used in forming the contact structure, a key-hole seam (represented by reference numeral 26) is present in the contact structure. The presence of the key-hole seam negatively affects contact performance and, as such, the formation of the same in a contact structure should be avoided.

In view of the above, there is a need for providing a new and improved high aspect ratio contact (hereinafter referred to as metallization) structure in which key-hole seam formation is avoided. That is, there is a need for providing a highly reliable high aspect ratio metallization structure in which key-hole seam formation within a high aspect ratio opening of the metallization structure is eliminated.

SUMMARY OF THE INVENTION

The present invention provides a semiconductor structure including a highly reliable high aspect ratio metallization structure in which key-hole seam formation is eliminated. The key-hole seam formation is eliminated in the present invention by providing a noble metal-containing material at least within a lower region of a high aspect ratio contact opening that is present within a dielectric material. The noble metal-containing material is in direct contact with an upper surface (comprised of a metal semiconductor alloy) of a material stack of a semiconductor device.

In one embodiment, the noble metal-containing material is a plug partially filling the lower region of the contact opening. In this embodiment, the plug of noble metal-containing material reduces the aspect ratio of the contact opening. When a plug of a noble metal-containing material is present within the contact opening, a conductive metal-containing material is present in an upper region of the contact opening and it is separated from the plug by a bottom wall portion of a U-shaped diffusion barrier. An optional U-shaped metal seed layer may also be present between the U-shaped diffusion barrier and the conductive metal-containing material.

In another embodiment of the present invention, the noble metal-containing material completely fills the contact opening.

In both embodiments mentioned above, the noble metal-containing material is formed by a selective deposition process such as, for example, chemical vapor deposition, plasma enhanced chemical vapor deposition, atomic layer deposition, and plasma enhanced atomic layer deposition. Since plating is not used in forming the noble metal-containing material, key-hole seams are eliminated in both the embodiments of the invention.

In one aspect, the invention provides a semiconductor structure that comprises:

at least one semiconductor device located on a surface of a semiconductor substrate, said at least one semiconductor device including at least a material stack having an upper surface that is comprised of a metal semiconductor alloy;

a dielectric material located on said surface of said semiconductor substrate, said dielectric material including a contact opening that extends to the upper surface of said material stack, said contact opening having an aspect ratio of greater than 3:1; and at least a noble metal-containing material present at least within a lower region of said contact opening, said noble metal-containing material is in direct contact with said upper surface of said material stack.

In one embodiment of the present invention, a conductive metal-containing material is also present within the contact opening. In this embodiment of the invention, the conductive metal-containing material is located within an upper portion of the contact opening and is separated from the noble metal-containing material by a bottom wall portion of at least a U-shaped diffusion barrier. In some instances, and when the conductive metal-containing material is formed by plating, a U-shaped plating seed layer is also present within the contact opening and located between the U-shaped diffusion barrier and the conductive metal-containing layer. In this embodiment of the present invention, the noble metal-containing material is a plug and may comprise one of Ru, Rh, Ir, Pt, Co, Pd and alloys thereof.

In another embodiment of the invention, the noble metal-containing material completely fills the contact opening and may comprise one of Ru, Rh, Ir, Pt, Co, Pd and alloys thereof.

In a preferred aspect of the invention, a semiconductor structure is provided that comprises:

at least one semiconductor device located on a surface of a semiconductor substrate, said at least one semiconductor device including at least a material stack having an upper surface that is comprised of a metal semiconductor alloy;

a dielectric material located on said surface of said semiconductor substrate, said dielectric material including a contact opening that extends to the upper surface of said material stack, said contact opening having an aspect ratio of greater than 3:1;

a noble metal-containing material located within a lower region of said contact opening, said noble metal-containing material is in direct contact with said upper surface of said material stack; and a conductive metal-containing material located within an upper portion of said contact opening and separated from said noble metal-containing material by a bottom wall portion of at least a U-shaped diffusion barrier.

In this preferred embodiment of the invention, a U-shaped plating seed layer may also be present within the contact opening and located between the U-shaped diffusion barrier and the conductive metal-containing layer. In the preferred embodiment of the invention described above, the noble metal-containing material is a plug and may comprise one of Ru, Rh, Ir, Pt, Co, Pd and alloys thereof. In the preferred embodiment of the invention described above, the conductive metal-containing material comprises Cu, Al, W and alloys. Also, in the preferred embodiment of the invention described above, the diffusion barrier may comprise one of Ta(N), Ti(N), W(N) and alloys.

In another aspect of the invention, a method of forming a semiconductor structure is provided that comprises:

providing a structure including at least one semiconductor device located on a surface of a semiconductor substrate, said at least one semiconductor device including at least a material stack having an upper surface that is comprised of a metal semiconductor alloy;

forming a dielectric material on said surface of said semiconductor substrate, said dielectric material including a contact opening that extends to the upper surface of said material stack, said contact opening having an aspect ratio of greater than 3:1; and filling said contact opening with at least a noble metal-containing material, said noble metal-containing material is present at least within a lower region of said contact opening and is in direct contact with said upper surface of said material stack.

In one embodiment of the inventive method, at least a U-shaped diffusion barrier and a conductive metal-containing material are also formed within the contact opening. In this embodiment of the inventive method, the conductive metal-containing material is located within an upper portion of the contact opening and is separated from the noble metal-containing material by a bottom wall portion of at least the U-shaped diffusion barrier. In cases wherein plating is used in forming the conductive metal-containing material, a U-shaped plating seed layer may also be formed within the contact opening. When present, the U-shaped plating layer is located between the U-shaped diffusion barrier and the conductive metal-containing layer. In the embodiments described above, the noble metal-containing material is a plug and may comprise one of Ru, Rh, Ir, Pt, Co, Pd and alloys thereof. In the embodiment described above, the conductive metal-containing material comprises Cu, Al, W and alloys. Also, in the embodiment described above, the diffusion barrier may comprise one of Ta(N), Ti(N), W(N) and alloys.

In another embodiment of the invention, the noble metal-containing material completely fills the contact opening and may comprise one of Ru, Rh, Ir, Pt, Co, Pd and alloys thereof.

In a further embodiment of the inventive method, the noble metal-containing material is formed by a selective deposition process selected from chemical vapor deposition, plasma enhanced chemical vapor deposition, atomic layer deposition, and plasma enhanced atomic layer deposition.

In a preferred embodiment of the inventive, the following processing steps are employed:

providing a structure including at least one semiconductor device located on a surface of a semiconductor substrate, said at least one semiconductor device including at least a material stack having an upper surface that is comprised of a metal semiconductor alloy;

forming a dielectric material on said surface of said semiconductor substrate, said dielectric material including a contact opening that extends to the upper surface of said material stack, said contact opening having an aspect ratio of greater than 3:1;

partially filling said contact opening with at least a noble metal-containing material, said noble metal-containing material is present within a lower region of said contact opening and is in direct contact with said upper surface of said material stack; and forming at least a U-shaped diffusion barrier and a conductive metal-containing material within said contact opening, said conductive metal-containing material is located within an upper portion of said contact opening and is separated from said noble metal-containing material by a bottom wall portion of at least said U-shaped diffusion barrier.

DETAILED DESCRIPTION OF THE INVENTION

The present invention, which provides a highly reliable high aspect ratio metallization structure and a method of fabricating the same, will now be described in greater detail by referring to the following discussion and drawings that accompany the present application. It is noted that the drawings that accompany the present application are provided for illustrative purposes only, and, as such, these drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides a high reliable high aspect metallization structure in which the formation of a key-hole seam within a high aspect ratio contact opening, particularly at an area of the high aspect ratio contact opening that is in close proximity to upper surface of the material stack of a semiconductor device, is eliminated.

Figure 1:
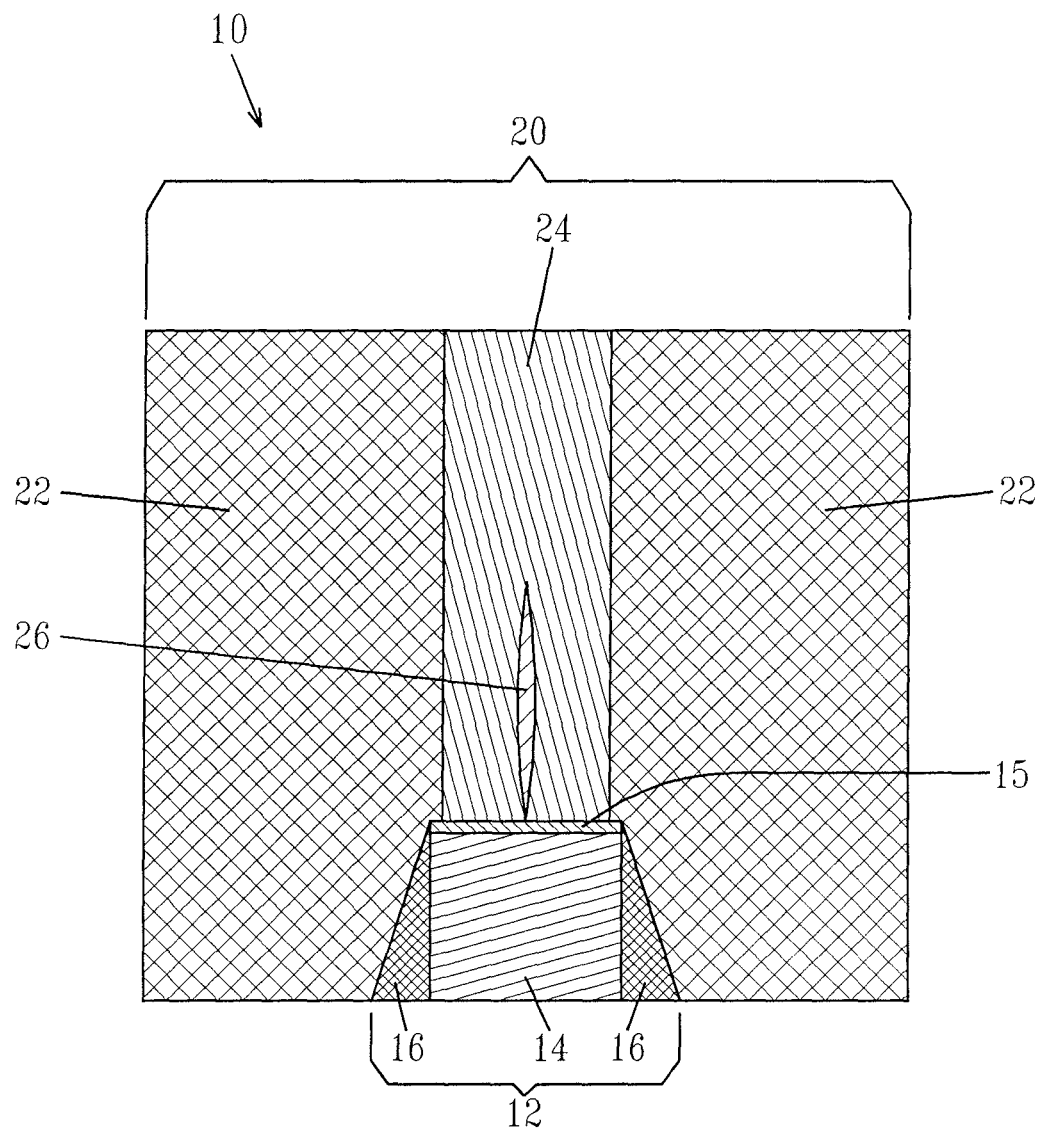
FIG. 1 is a pictorial representation (through a cross sectional view) illustrating a prior art high aspect ratio metal plated metallization structure in which a key-hole seam is inherently present.
Figure 2A:
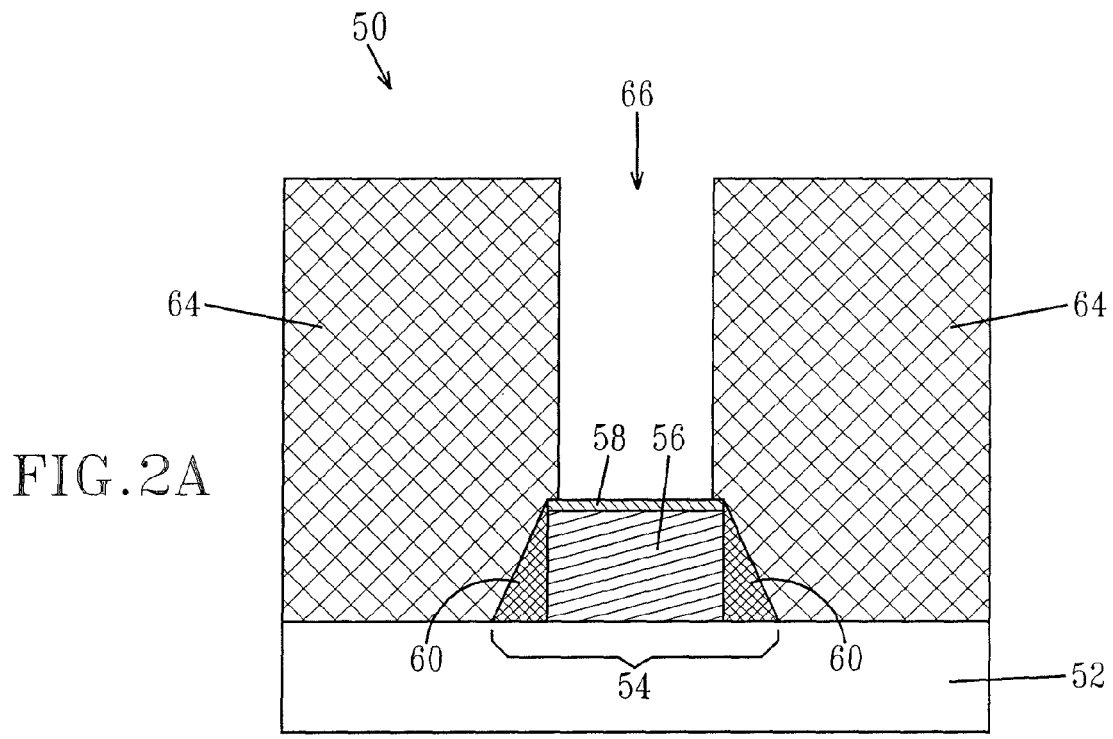
FIGS. 2A-2E are pictorial representations (through cross sectional views) illustrating one method of the present invention for forming a reliable high aspect ratio metallization structure in which key-hole seam production is avoided.

Reference is now made to FIGS. 2A-2E which are pictorial representations (through cross sectional views) illustrating one method of the present invention for forming a reliable high aspect ratio metallization structure. FIG. 2A illustrates an initial structure 50 that can be employed in the present invention.

The initial structure 50 includes a semiconductor substrate 52 having at least one semiconductor device 54 located thereon. In accordance with the present invention, the at least one semiconductor device 54 includes a material stack 56 having an upper surface 58 that comprises a semiconductor metal alloy (i.e., a silicide or germanide). It is noted that in the drawings, the one semiconductor device 54 is depicted as a field effect transistor (FET). Although such a semiconductor device 54 is depicted and illustrated, the present invention also contemplates other semiconductor devices including, for example, capacitors, diodes, bipolar transistors, BiCMOS devices, memory devices and the like which include a patterned material stack having an upper surface that is comprised of a metal semiconductor alloy. Also, although illustration is made to a patterned material stack, the present invention also works in embodiments in which the material stack is non-patterned.

The term "semiconductor substrate" is used throughout this application to denote any semiconducting material including, for example, Si, SiGe, SiGeC, SiC, Ge alloys, GaAs, InAs, InP and other III/V or II/VI compound semiconductors. In addition to these listed types of semiconducting materials, the present invention also contemplates cases in which the semiconductor substrate 52 is a layered semiconductor such as, for example, Si/SiGe, Si/SiC, silicon-on-insulators (SOIs) or silicon germanium-on-insulators (SGOIs). In some embodiments of the present invention, it is preferred that the semiconductor substrate 52 be composed of a Si-containing semiconductor material, i.e., a semiconductor material that includes silicon. The semiconductor substrate 52 may be doped, undoped or contain doped and undoped regions therein.

It is also noted that the semiconductor substrate 52 may be strained, unstrained or contain strained regions and unstrained regions therein. The semiconductor substrate 52 may also have a single crystal orientation or alternatively, the substrate 52 may be a hybrid semiconductor substrate that has surface regions having different crystallographic orientations. The semiconductor substrate 52 may also have one or more isolation regions such as, for example, trench isolation regions or field oxide isolation regions, located therein.

Next, the at least one semiconductor device 54 including a material stack 56 (patterned or non-patterned) having an upper surface 58 that comprises a metal semiconductor alloy is formed. The at least one semiconductor device 54 is formed utilizing conventional techniques that are well known to those skilled in the art. The processing details may vary depending on the type of device being fabricating. In the case of a field effect transistor, deposition, lithography, etching and ion implantation can be used in forming the field effect transistor. Alternatively, a replacement gate process can be used in forming the field effect transistor.

Figure 4:
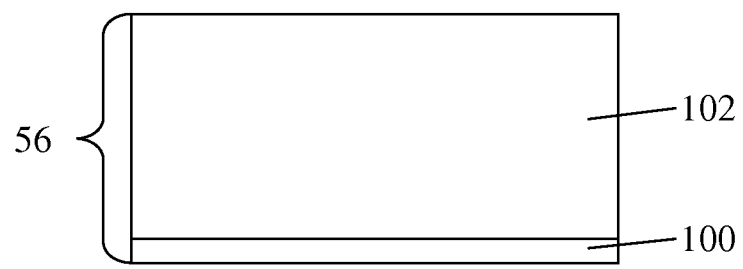
FIG. 4 is a pictorial representation (through a cross sectional view) showing the various components that can be employed as the material stack shown in FIGS. 2A, 2B, 2C, 2D, 2E and 3.

In the case of a field effect transistor, the material stack 56 further includes a gate dielectric 100 and an overlying gate conductor 102 such as shown, for example, in FIG. 4. The FET also includes at least one spacer 60 located on exposed sidewalls of the material stack 56, and source/drain regions (not specifically shown or labeled) located within the semiconductor substrate 52 at the footprint of the material stack 56. The gate dielectric, the gate conductor and the spacer 60 are comprised of conventional materials. For example, the gate dielectric is comprised of an oxide, nitride, oxynitride or combinations and multilayers thereof. The gate conductor is comprised of polySi, SiGe, an elemental metal, an alloy including an elemental metal, a metal silicide, a metal nitride or any combination including multilayers thereof. The spacer 60, which is optional, is comprised of an oxide, a nitride, an oxynitride or any combination, including multilayers thereof.

The metal semiconductor alloy that is located at the upper surface 58 of material stack 56 is formed utilizing a standard salicidation ('self-aligned') process well known in the art. This includes forming a metal capable of reacting with a semiconductor material atop the entire structure, forming a barrier layer atop the metal, heating the structure to form a metal semiconductor alloy, removing non-reacted metal and the barrier layer and, if needed, conducting a second heating step. When a semiconductor material is not present, a layer of a semiconductor-containing material can be formed prior to forming the metal. The second heating step is required in those instances in which the first heating step does not form the lowest resistance phase of the metal semiconductor alloy.

The metal used in forming the metal semiconductor alloy comprises one of Ti, Ni, Pt, W, Co, Ir, and the like. Alloying additives can also be present as desired. The heating, i.e., anneal, step used in forming the metal semiconductor alloy includes conditions that are well known to those skilled in the art. It is noted that during the formation of the metal semiconductor alloy layer atop the material stack, a metal semiconductor alloy can be also formed on any exposed surfaces of the semiconductor substrate in which the metal was formed.

The initial semiconductor structure 50 shown in FIG. 2A also includes a dielectric material 64 including a contact opening 66. As shown, the contact opening 66 exposes the upper surface 58 (i.e., the semiconductor metal alloy) of the material stack 56.

The dielectric material 64 may comprise any dielectric used in middle of the line (MOL) and/or back end of the line (BEOL) applications. The dielectric material 64 may be porous or non-porous. Some examples of suitable dielectrics that can be used as the dielectric material 64 include, but are not limited to: $SiO_2$, a doped or undoped silicate glass, C doped oxides (i.e., organosilicates) that include atoms of Si, C, O and H, silsesquioxanes, thermosetting polyarylene ethers, or multilayers thereof, silicon nitride, silicon oxynitride or any combination, including multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. In one embodiment, the dielectric material 64 is $SiO_2$ that is formed from a TEOS (tetraethylorthosilane) precursor.

The dielectric material 64 typically has a dielectric constant that is about 4.0 or less, with a dielectric constant of about 2.8 or less being even more typical. The thickness of the dielectric material 64 may vary depending upon the dielectric material used. Typically, and for normal MOL and/or BEOL applications, the dielectric material 64 has a thickness from about 200 to about 450 nm.

The contact opening 66 that is present within the dielectric material 64 is formed by lithography and etching. The lithographic process includes forming a photoresist (not shown) atop the dielectric material 64, exposing the photoresist to a desired pattern of radiation and developing the exposed photoresist utilizing a conventional resist developer. The etching process includes a dry etching process (such as, for example, reactive ion etching, ion beam etching, plasma etching or laser ablation), or a wet chemical etching process that selectively removes the exposed dielectric material 64. Typically, reactive ion etching is used in providing the contact opening 66. After etching, the photoresist is typically removed utilizing a conventional resist stripping process well known to those skilled in this art. As shown, the contact opening 66 has sidewalls. The sidewalls within the contact opening 66 may be substantially vertical, as shown, or some tapering may be evident. The contact opening 66 typically has an aspect ratio that is greater than 3, preferably greater than 5, more preferably greater than 10:1. The contact opening 66 may be referred to in the art as a via opening.

After providing the initial structure 50 shown in FIG. 2A, a noble metal-containing material is selectively deposited on the upper surface 58 of the material stack 54 that is comprised of the metal semiconductor alloy. The noble metal-containing material includes any metal or metal alloy that is resistant to corrosion or oxidation. Moreover, the noble metal-containing material employed in the present invention includes any metal or metal alloy which is lower in the "Galvanic Series" than the underlying metal semiconductor alloy layer and the overlying conductive metal-containing material to be subsequently formed. Typically, the noble metal-containing material comprises one of Ru, Rh, Ir, Pt, Co, Pd and alloys thereof, with Ru being highly preferred in some embodiments of the present invention. It is noted that in the embodiment of the present invention illustrated, the noble metal-containing material is a noble metal-containing plug 68 that partially fills the contact opening 66 and therefore reduces the aspect ratio of the contact opening 66.

Figure 2B:
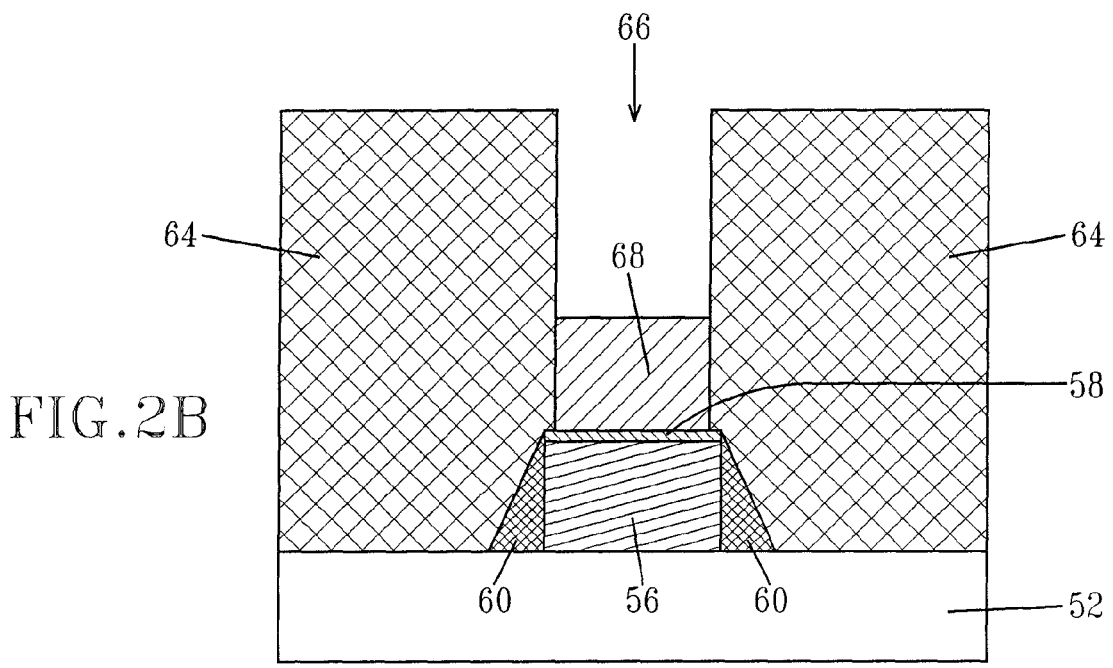

As shown in FIG. 2B, the noble metal-containing material is formed by a selective deposition process such as, for example, chemical vapor deposition (CVD), plasma enhanced chemical vapor deposition (PECVD), atomic layer deposition (ALD), and plasma enhanced atomic layer deposition (PEALD). The precursors and conditions for the selective deposition, which are well known to those skilled in the art, may vary depending on the exact deposition process used in forming the noble metal-containing material.

It is again noted that in the embodiment illustrated, the noble metal-containing material is a plug 68 that does not completely fill the contact opening 66. Partial filling of the contact opening 66 with a noble metal-containing material can be achieved by selecting proper deposition times, i.e., rates. Alternatively, the partial filling of the contact opening 66 with the noble metal-containing material may be achieved by deposition which provides noble metal-containing material outside the contact opening 66, planarization, and etching. The distance of the upper surface of the noble metal-containing plug 68 to the mouth of the contact opening 66 may vary and is not critical so long as the plug 68 including the noble metal-containing material reduces the overall aspect ratio of the contact opening 66.

Figure 2C:
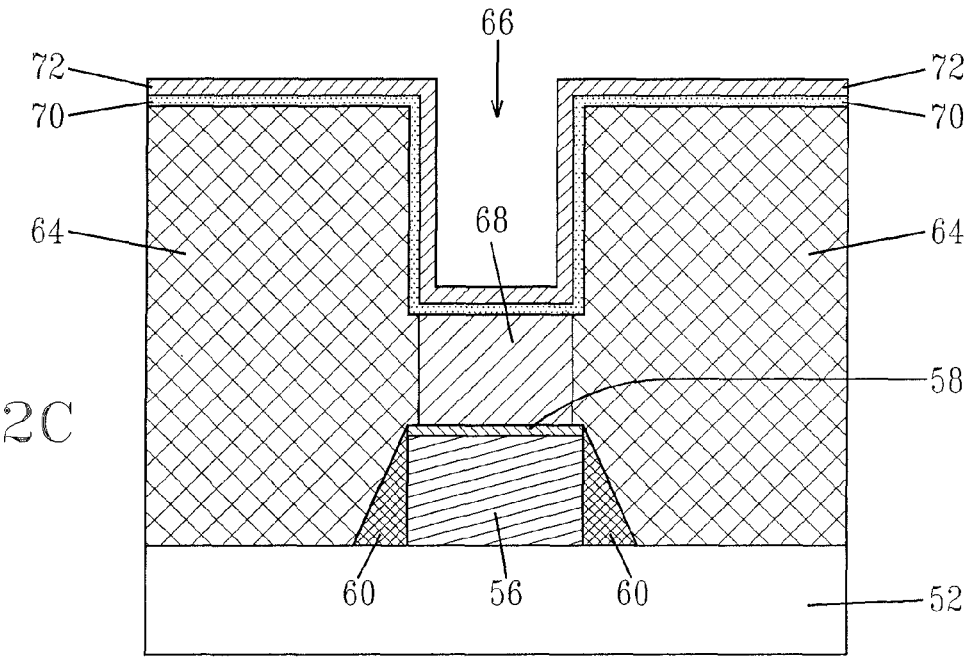

Next, and as shown in FIG. 2C, a diffusion barrier 70 and an optional plating seed layer 72 can be provided to the structure shown in FIG. 2B. As illustrated, the diffusion barrier 70 and the optional plating seed layer 72 are present within the contact opening 66 including atop an upper surface of the plug 68 of noble metal-containing material also well as extending on the upper surface of the dielectric material 64.

The diffusion barrier 70 comprises Ta, TaN, Ti, TiN, Ru, RuN, RuTa, RuTaN, W, WN or any other material that can serve as a barrier to prevent a conductive material from diffusing there through. The thickness of the diffusion barrier 70 may vary depending on the deposition process used as well as the material employed. Typically, the diffusion barrier 70 has a thickness from about 2 to about 50 nm, with a thickness from about 5 to about 20 nm being more typical.

The diffusion barrier 70 is formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

Next, an optional plating seed layer 72 can be formed on the surface of the diffusion barrier 70. In cases in which the conductive material to be subsequently formed does not involve plating, the optional plating seed layer 72 is not needed. The optional plating seed layer 72 is employed to selectively promote subsequent electroplating of a pre-selected conductive metal or metal alloy. The optional plating seed layer 72 may comprise Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the opening 66.

The thickness of the optional seed layer 72 may vary depending on the material of the optional plating seed layer as well as the technique used in forming the same. Typically, the optional plating seed layer 72 has a thickness from about 2 to about 80 nm.

The optional plating seed layer 72 can be formed by a conventional deposition process including, for example, CVD, PECVD, ALD, and physical vapor deposition (PVD).

Figure 2D:
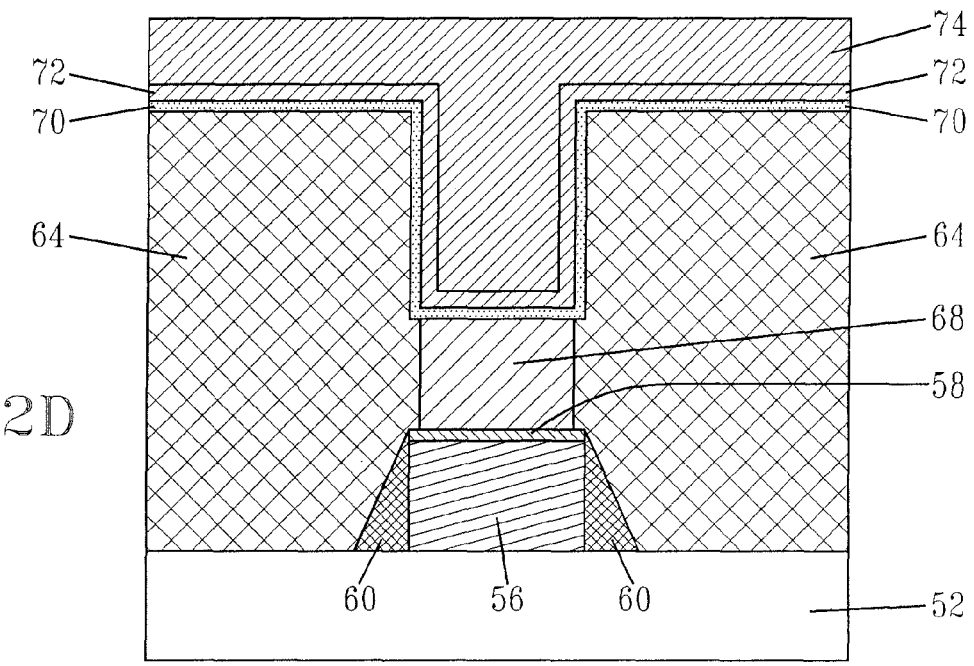

A conductive metal-containing layer 74 is then formed within the remaining portion of opening 66 as well as atop the surface of any of the optional plating seed layer 72 or the diffusion barrier 70 that extends beyond the opening 66 providing the structure shown in FIG. 2D. The conductive metal-containing layer 74 employed in the present invention includes for example, a conductive metal, an alloy comprising at least one conductive metal, a metal silicide or any combination thereof. Preferably, the conductive metal-conductive-containing metal comprises a conductive metal such as, for example, Cu, W or Al, with Cu and W being highly preferred. The conductive metal-containing layer 74 can be formed utilizing a conventional deposition process such as, for example, CVD, PECVD, ALD, PEALD, sputtering chemical solution deposition or plating (electro or electroless). In one embodiment of the present invention, and when the conductive metal-containing layer 74 comprises Cu, electroplating is used in forming the Cu layer. In another embodiment, and when the conductive metal-containing layer 74 comprises W, CVD or PECVD is used in forming the W layer.

Figure 2E:
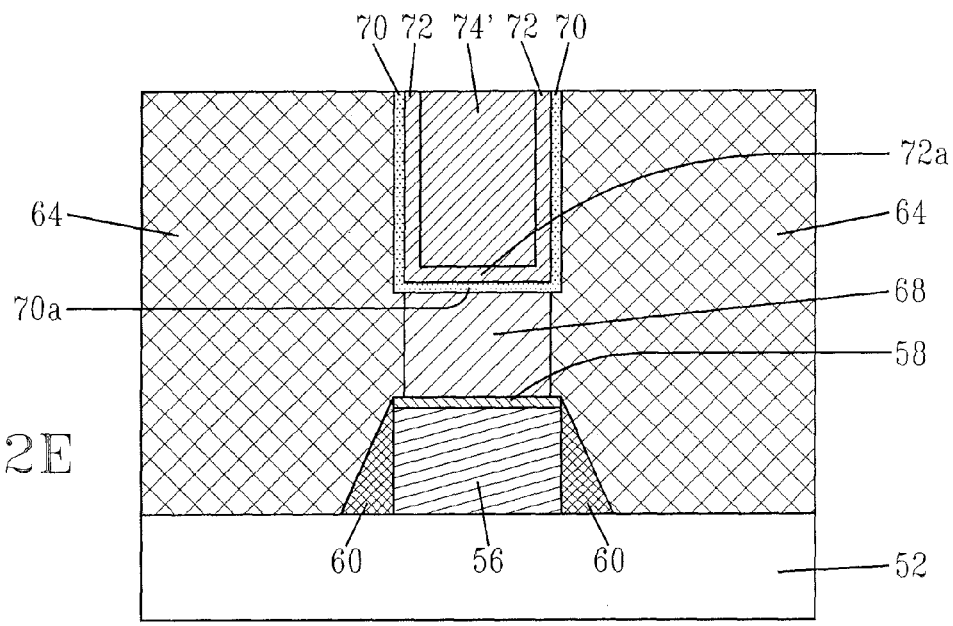

After deposition of the conductive metal-containing layer 74, the structure shown in FIG. 2D is subjected to a conventional planarization process providing the structure shown, for example, in FIG. 2E. Conventional planarization processes that can be employed in the present invention in providing the planar structure shown in FIG. 2E include chemical mechanical polishing (CMP), grinding, or a combination of CMP and grinding. In FIG. 2E, reference numeral 74' denotes the remaining conductive metal-containing layer that is present within the contact opening 66. It is noted that the planarization provides a structure in which the upper surface of each of the dielectric material 64, the diffusion barrier 70, the optional plating seed layer 72 and the remaining conductive metal-containing layer 74' is coplanar with each other. Planarization provides a U-shaped diffusion barrier and, if present, a U-shaped plating seed layer within the contact opening 66.

It is further noted that in the structure shown in FIG. 2E, the contact metallurgies within the metallization structure includes an upper region of a conductive metal-containing material 74' and a lower region of a noble metal-containing plug 68 which are separated by the bottom wall portion 70a of at least the U-shaped diffusion barrier layer or, if present, a bottom wall portion 72a of the U-shaped plating seed layer. The remaining conductive metal-containing material 74' is also separated from the dielectric material 64 by sidewall portions of at least the U-shaped diffusion barrier layer 70 that remains in the contact opening 66.

Figure 3:
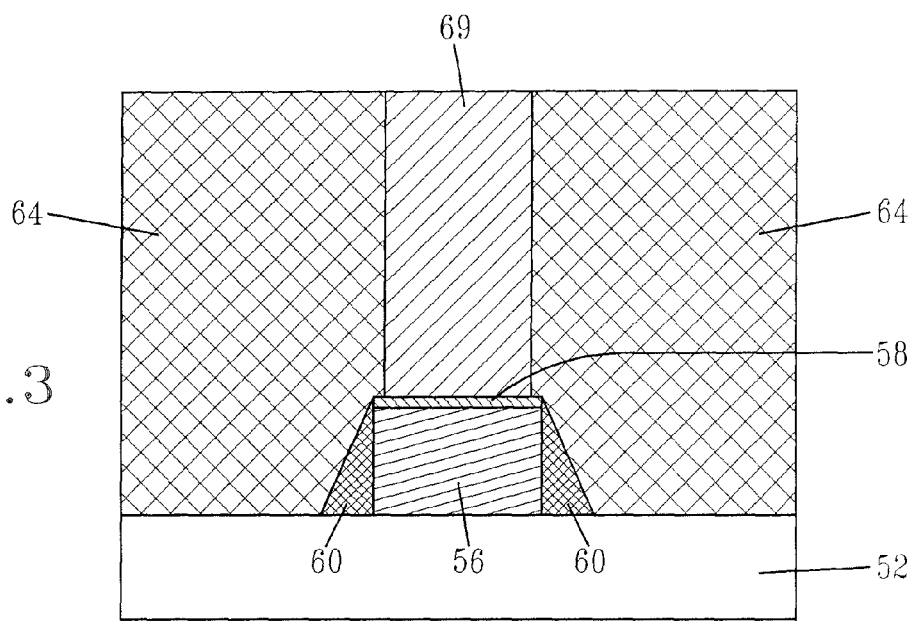
FIG. 3 is a pictorial representation (through a cross sectional view) illustrating another embodiment of the present invention.

In another embodiment, which is shown in FIG. 3, the structure shown in FIG. 2A is first provided and thereafter a noble metal-containing material is deposited to completely fill the contact opening 66. The noble metal-containing material is the same as that described above for plug 68. A planarization process may be used to remove any noble metal-containing material that forms outside the at least one opening. In the embodiment of the present invention, the metallurgy of the metallization structure consists entirely of a noble metal-containing material 69.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:
   providing a structure including at least one semiconductor device located on a surface of a semiconductor substrate, said at least one semiconductor device including at least a material stack having an upper surface that is comprised of a metal semiconductor alloy;
   forming a single layer of dielectric material on said surface of said semiconductor substrate, said single layer of dielectric material including a contact opening that extends to the upper surface of said material stack, said contact opening having an aspect ratio of greater than 3:1; and
   partially filling said contact opening in said single layer of dielectric material with at least a metal-containing material that is resistant to corrosion and oxidation and is lower in the Galvanic Series than said metal semiconductor alloy utilizing a selective deposition process selected from chemical vapor deposition, plasma enhanced chemical vapor deposition, atomic layer deposition, and plasma enhanced atomic layer deposition, said metal-containing material is present within a lower region of said contact opening and is in direct contact with said upper surface of said material stack, wherein said metal-containing material has a top surface located beneath a top surface of said single layer of dielectric material.

2. The method of claim 1 further comprising forming at least a U-shaped diffusion barrier and a conductive metal-containing material within said contact opening, said conductive metal-containing material is located within an upper portion of said contact opening and is separated from said metal-containing material by a bottom wall portion of at least said U-shaped diffusion barrier.

3. The method of claim 2 further comprising forming a U-shaped plating seed layer present within said contact opening, said U-shaped plating layer is present between said U-shaped diffusion barrier and said conductive metal-containing layer.

4. The method of claim 1 wherein said metal-containing material is a plug and comprises one of Ru, Rh, Ir, Pt, Co, Pd and alloys thereof.

5. The method of claim 2 wherein said conductive metal-containing material is one of Cu, W, and Al, and said diffusion barrier comprises one of Ta(N), Ti(N), W(N), and Ru(N).

6. The method of claim 2 wherein said conductive metal-containing material has an uppermost surface that is coplanar with an uppermost surface of said single layer of dielectric material.

7. The method of claim 1 wherein said contact opening is formed by lithography and etching.

8. A method of forming a semiconductor structure comprising:
   providing a structure including at least one semiconductor device located on a surface of a semiconductor substrate, said at least one semiconductor device including at least a material stack having an upper surface that is comprised of a metal semiconductor alloy;
   forming a single layer of dielectric material on said surface of said semiconductor substrate, said single layer of dielectric material including a contact opening that extends to the upper surface of said material stack, said contact opening having an aspect ratio of greater than 3:1;

partially filling said contact opening in said single layer of dielectric material with at least a metal-containing material that is resistant to corrosion and oxidation and is lower in the Galvanic Series than said metal semiconductor alloy, said metal-containing material is present within a lower region of said contact opening and is in direct contact with said upper surface of said material stack;

forming at least a U-shaped diffusion barrier and a conductive metal-containing material within said contact opening, said conductive metal-containing material is located within an upper portion of said contact opening and is separated from said metal-containing material by a bottom wall portion of at least said U-shaped diffusion barrier, and said conductive metal-containing material has an uppermost surface that is coplanar with an uppermost surface of said single layer of dielectric material.

9. The method of claim 8 further comprising forming a U-shaped plating seed layer within said contact opening, said U-shaped plating layer is present between said U-shaped diffusion barrier and said conductive metal-containing layer.

10. The method of claim 8 wherein said metal-containing material is a plug and comprises one of Ru, Rh, Ir, Pt, Co, Pd and alloys thereof.

11. The method of claim 8 wherein said conductive metal-containing material is one of Cu, W, and Al, and said diffusion barrier comprises one of Ta(N), Ti(N), W(N), and Ru(N).

12. The method of claim 8 wherein said metal-containing material is formed by a selective deposition process selected from chemical vapor deposition, plasma enhanced chemical vapor deposition, atomic layer deposition, and plasma enhanced atomic layer deposition.

13. The method of claim 8 wherein said contact opening is formed by lithography and etching.

14. The method of claim 8 wherein said metal semiconductor alloy is formed by a salicidation process.

15. The method of claim 8 wherein said aspect ratio is greater than 10:1.

16. The method of claim 8 wherein noble metal-containing material is void of any key-hole seam defects.

17. The method of claim 8 wherein said partially filling said contact opening with at least said metal-containing material comprises a timed deposition process.

18. The method of claim 8 wherein said partially filling said contact opening with at least said metal-containing material comprises deposition and etching.

* * * * *